United States Patent
Evans et al.

(10) Patent No.: US 7,139,292 B1
(45) Date of Patent: Nov. 21, 2006

(54) CONFIGURABLE MATRIX ARCHITECTURE

(75) Inventors: Brian P. Evans, Starkville, MS (US); Jeffery Scott Hunt, Ackerman, MS (US)

(73) Assignee: Cypress Semiconductor Corp., San Jose, CA (US)

( * ) Notice: Subject to any disclaimer, the term of this patent is extended or adjusted under 35 U.S.C. 154(b) by 846 days.

(21) Appl. No.: 09/943,947

(22) Filed: Aug. 31, 2001

(51) Int. Cl.
*H04J 3/02* (2006.01)

(52) U.S. Cl. .................. 370/539; 370/537; 370/388

(58) Field of Classification Search ............... 370/211, 370/218, 916, 541, 539, 534; 326/38, 39
See application file for complete search history.

(56) References Cited

U.S. PATENT DOCUMENTS

| | | | | |
|---|---|---|---|---|
| 4,809,221 A | * | 2/1989 | Magliocco et al. | 713/401 |
| 5,001,711 A | * | 3/1991 | Obana et al. | 370/535 |
| 5,015,884 A | * | 5/1991 | Agrawal et al. | 326/39 |
| 5,123,015 A | * | 6/1992 | Brady et al. | 370/539 |
| 5,371,422 A | * | 12/1994 | Patel et al. | 326/41 |
| 5,376,844 A | * | 12/1994 | Pedersen et al. | 326/41 |
| 5,521,529 A | * | 5/1996 | Agrawal et al. | 326/41 |
| 5,744,980 A | * | 4/1998 | McGowan et al. | 326/40 |
| 5,869,982 A | * | 2/1999 | Graf | 326/40 |
| 5,966,027 A | * | 10/1999 | Kapusta et al. | 326/39 |
| 6,128,770 A | * | 10/2000 | Agrawal et al. | 716/17 |
| 6,137,308 A | * | 10/2000 | Nayak | 326/39 |
| 6,185,126 B1 | * | 2/2001 | Rodgers et al. | 365/154 |
| 6,243,664 B1 | * | 6/2001 | Nazarian et al. | 703/14 |
| 6,292,021 B1 | * | 9/2001 | Furtek et al. | 326/41 |
| 6,348,813 B1 | * | 2/2002 | Agrawal et al. | 326/41 |
| 6,370,140 B1 | * | 4/2002 | Nayak | 370/386 |
| 6,467,073 B1 | * | 10/2002 | Merchant | 716/16 |
| 6,563,340 B1 | * | 5/2003 | Jones | 326/41 |
| 6,609,243 B1 | * | 8/2003 | Evans et al. | 716/16 |
| 6,696,855 B1 | * | 2/2004 | Kapusta et al. | 326/39 |
| 6,815,984 B1 | * | 11/2004 | Bowers et al. | 327/112 |
| 6,864,710 B1 | * | 3/2005 | Lacey et al. | 326/39 |

OTHER PUBLICATIONS

Benjamin J. Bowers et al., "Push/Pull Multiplexer BIT", U.S. Appl. No. 09/940,406, filed Aug. 27, 2001.
Brian P. Evans et al., "Layout Architecture to Optimize Path Delays", U.S. Appl. No. 09/941,352, filed Aug. 29, 2001.

* cited by examiner

*Primary Examiner*—Ricky Q. Ngo
*Assistant Examiner*—Andrew C. Lee

(57) ABSTRACT

An apparatus comprising a distributed multiplexer configured to receive a distributed input group of signals. The distributed multiplexer may be configured to evenly load the distributed input groups.

18 Claims, 5 Drawing Sheets

CONFIGURABLE MATRIX ARCHITECTURE

CROSS REFERENCE TO RELATED APPLICATIONS

The present application may relate to U.S. Pat. No. 6,815,984, issued Nov. 9, 2004 and U.S. Pat. No. 6,609,243, issued Aug. 19, 2003, which are each hereby incorporated by reference in their entirety.

FIELD OF THE INVENTION

The present invention relates to a method and/or architecture for implementing configurable matrices generally and, more particularly, to a method and/or architecture for implementing multiple configurable matrices having distributed multiplexers and shared input groups.

BACKGROUND OF THE INVENTION

A number of conventional approaches are used to implement multiplexers within configurable matrices. Configurable matrices implement one or more multiplexers of varying widths. Configurable matrices also have a variable number of inputs and outputs.

SUMMARY OF THE INVENTION

The present invention concerns an apparatus comprising a distributed multiplexer configured to receive a distributed input group of signals. The distributed multiplexer may be configured to evenly load the distributed input groups.

The objects, features and advantages of the present invention include providing an architecture and/or method for implementing configurable matrices that may (i) be scalable, (ii) utilize layout area efficiently, (iii) reduce or eliminate the need to re-order matrix inputs, (iv) equalize output routing, (v) allow flexibility of reprogramming multiplexer connections without requiring complete rework of the configurable matrix, and/or (vi) accommodate multiplexers of varying sizes.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
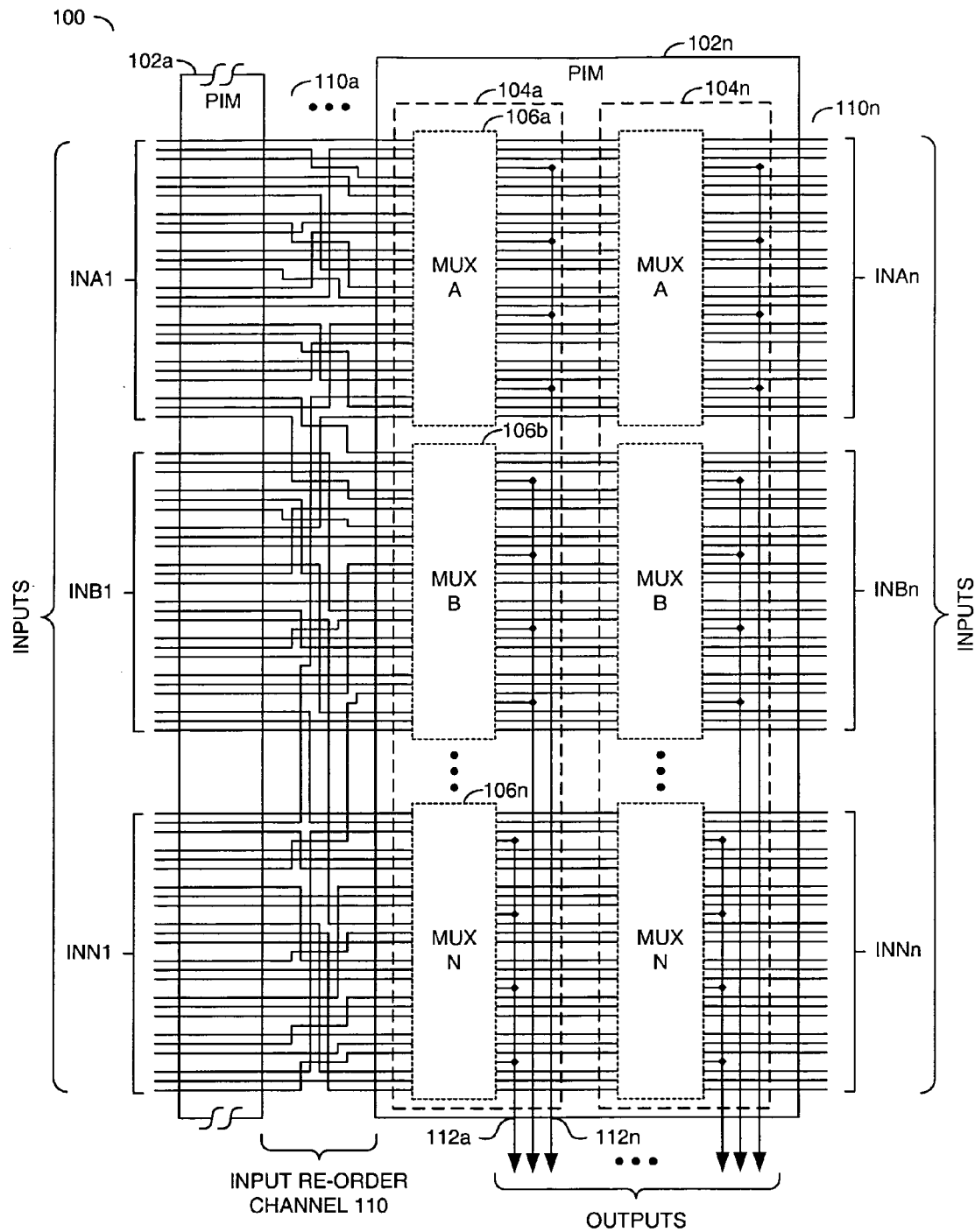
FIG. 1 is a block diagram of an embodiment of the present invention.

Referring to FIG. 1, a block diagram of a circuit (or system) 100 is shown in accordance with an embodiment of the present invention. The circuit 100 generally comprises a number of configurable matrices 102$a$–102$n$. A configurable matrix may enable a number of inputs to be routed to a number of outputs and may be referred to as a programmable interconnect matrix (PIM). Each PIM 102$a$–102$n$ generally comprises a number of multiplexer columns 104$a$–104$n$. Each multiplexer column 104$a$–104$n$ generally comprises a number of multiplexers 106$a$–106$n$. The circuit 100 may have inputs (e.g., INPUTS) grouped independently for each of the PIMs 102$a$–102$n$ (e.g., INA1–INNn). For example, a multiplexer in the PIM 102$a$ may receive the input group INA1, while the multiplexer 106$a$ in the PIM 102$n$ may receive the input group INAn. Each of the PIMs 102$a$–102$n$ may also comprise an input re-order channel 110. The input re-order channel 110 may be shown as a number of re-order channels 110$a$–110$n$ for each PIM 102$a$–102$n$. The number of PIMs 102$a$–102$n$ may be different than the number of re-order channels 110. The channels 110$a$–110$n$ are configured to re-order the input signals for each of the PIMs 102$a$–102$n$ (e.g., the input re-order channel 110 provides re-ordering for each of the input groups INA1–INAn). For example, the input re-order channel 110$a$ may re-order the input groups INA1–INN1. Additionally, each multiplexer column 104$a$–104$n$ may have a number of output routes 112$a$–112$n$ that may present a signal (e.g., OUTPUTS).

Figure 2:
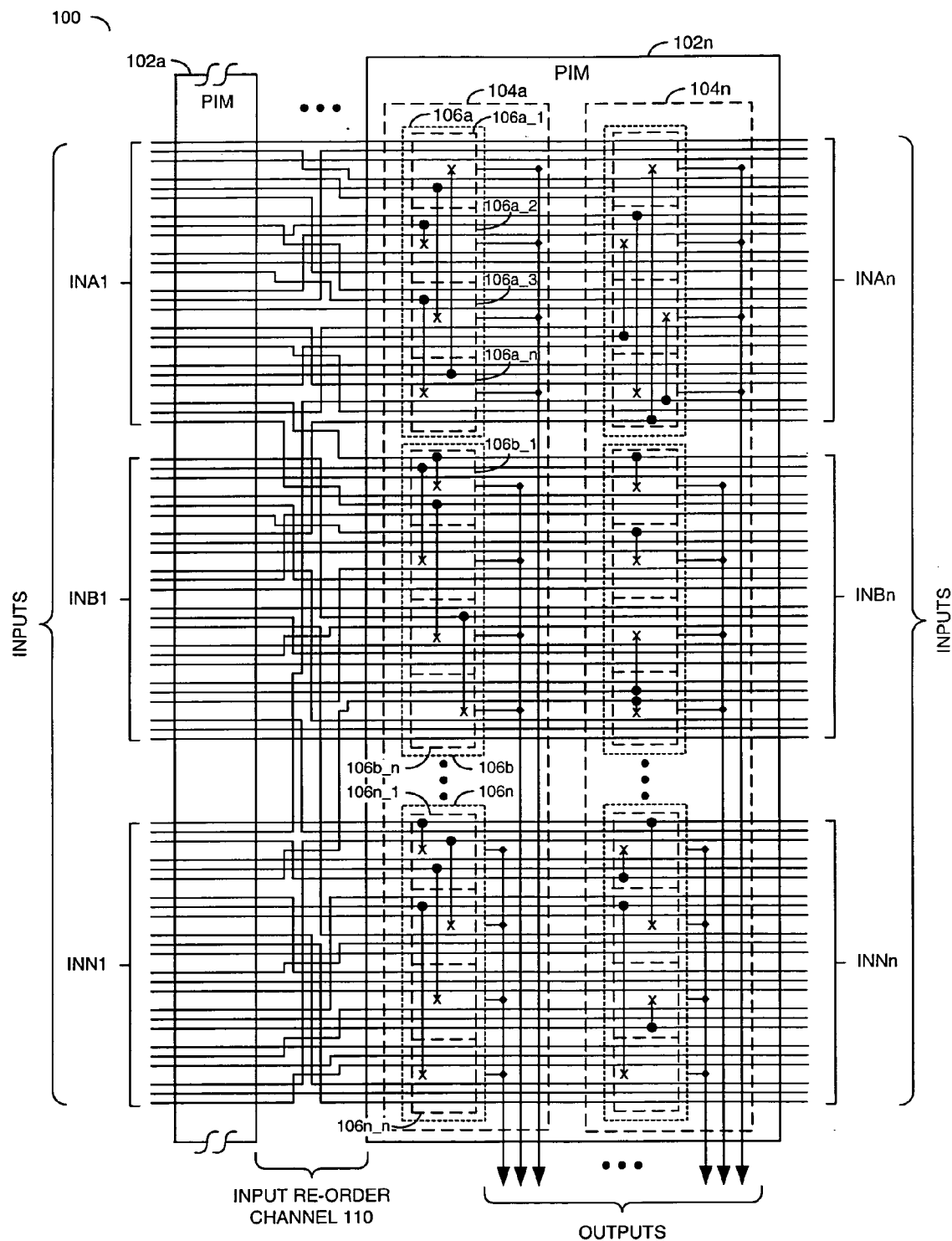
FIG. 2 is a detailed block diagram of the circuit of FIG. 1.

Referring to FIG. 2, a detailed schematic of the multiplexer columns 104$a$–104$n$ and the multiplexers 106$a$–106$n$ are shown. Each of the multiplexers 106$a$–106$n$ may comprise n number of multiplexer bits, where n is an integer. For example, the multiplexer 106$a$ may comprise the bits 106$a$_1–106$a$_$n$. Each of the multiplexer bits 106$a$_1–106$n$_$n$ may be coupled to the outputs OUTPUTS. The multiplexer bits 106$a$_1–106$n$_$n$ may require variable length output routing (e.g., vertical and horizontal routing). Such output routing may introduce variable delay into the circuit 100. The input re-order channels 110$a$–110$n$ of the PIMs 102$a$–102$n$ may also cause different loading on the inputs which may increase the propagation delay through the PIMs 102$a$–102$n$. Additionally, the width of the PIMs 102$a$–102$n$ is generally set by the internal input re-ordering channel 110$a$–110$n$ and/or output routing rather than the area of each PIM 102$a$–102$n$.

While the circuit 100 may connect a number of PIMs 102$a$–102$n$, the circuit 100 may have (i) non-deterministic parasitic loading on the inputs INPUTS, (ii) different loading parasitics on the outputs OUTPUTS, and (iii) non-deterministic best case and worst case delay paths. Also, layout rework may be required to reprogram the circuit 100. Furthermore, the circuit 100 is not easily scalable.

Figure 3:
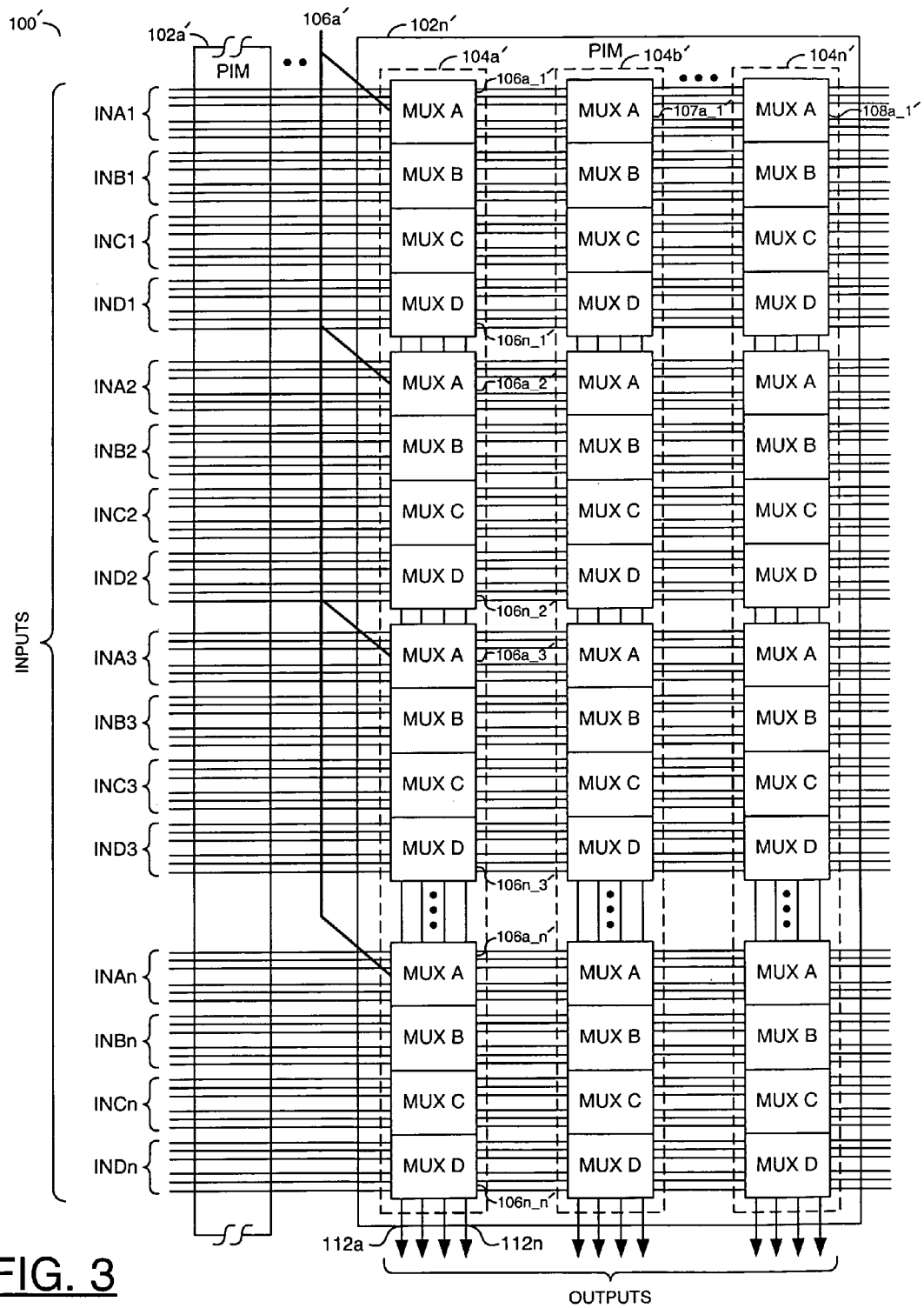
FIG. 3 is a block diagram of another embodiment of the present invention.

Referring to FIG. 3, a block diagram of a circuit (or system) 100' is shown in accordance with another embodiment of the present invention. The circuit 100' may be similar to the circuit 100. However, the circuit 100' may be configured to share input groups across multiple programmable interconnect matrices (PIMs). The circuit 100' may allow input groups to be defined across multiple PIMs. The PIMs may comprise one or more distributed multiplexer circuits. The system 100' may be expanded in either a horizontal or a vertical direction for optimum routability. The system 100' may allow variable multiplexer widths. The system 100' may provide a deterministic (i) layout area and/or (ii) best case and worst case delay path. The system 100' may also be scalable across a family of devices. Furthermore, the system 100' may provide flexible re-programing of multiplexer connections.

Each of the PIMs 102$a'$–102$n'$ are shown comprising a number of multiplexer columns 104$a'$–104$n'$. The particular number of columns 104$a'$–104$n'$ may be varied in order to meet the design criteria of a particular implementation. Each of the multiplexer columns 104$a'$–104$n'$ may comprise a number of multiplexers 106a'–106n' (also labeled MUXA, MUXB, MUXC and MUXD). The multiplexers 106a'–106n' may be implemented as distributed multiplexers. In one example, the multiplexers 106a'–106n' may be implemented as 4:1 multiplexers. However, other appropriate type multiplexers configurations may be implemented accordingly to meet the design criteria of a particular application. Each of the multiplexers 106a'–106n' may comprise n number of bits, where n is an integer. For example, the multiplexer 106a' may comprise the bits 106a_1'–106a__n'. The multiplexer bits 106a_1'–106n__n' may be implemented as PIM bits.

Each of the distributed multiplexers 106a'–106n' may receive a distributed input group (e.g., INA1–INDn). For example, the bit 106a_1' may receive the input group INA1, the bit 106a_2' may receive the input group INA2, the bit 106a_3' may receive the input group INA3, and the bit 106a__n' may receive the input group INAn. The distributed input groups INA, INB, INC and IND may be derived from the signal INPUTS. The distributed input groups INA, INB, INC and IND may be constant across the PIMS 102a'–102n'. The input groups INA, INB, INC and IND may also be constant across the multiplexer columns 104a'–104n'. The number of input groups may be varied in order to meet the design criteria of a particular implementation. The multiplexers 106a'–106n' of the columns 104a'–104n' may be coupled to the output lines OUTPUTS.

The input signals INPUTS are generally grouped such that the same groups (e.g., INA, INB, INC and IND) may be routed over all of the PIMs 102a'–102n'. Each multiplexer bit generally connects to only one input signal. The input signal groups INA, INB, INC and IND may be routed over the bounding box of the multiplexer bit to which the input signal connects. The PIMs 102a'–102n' may be expanded or contracted according to the number of input routes or multiplexers implemented in the PIM.

Figure 4:
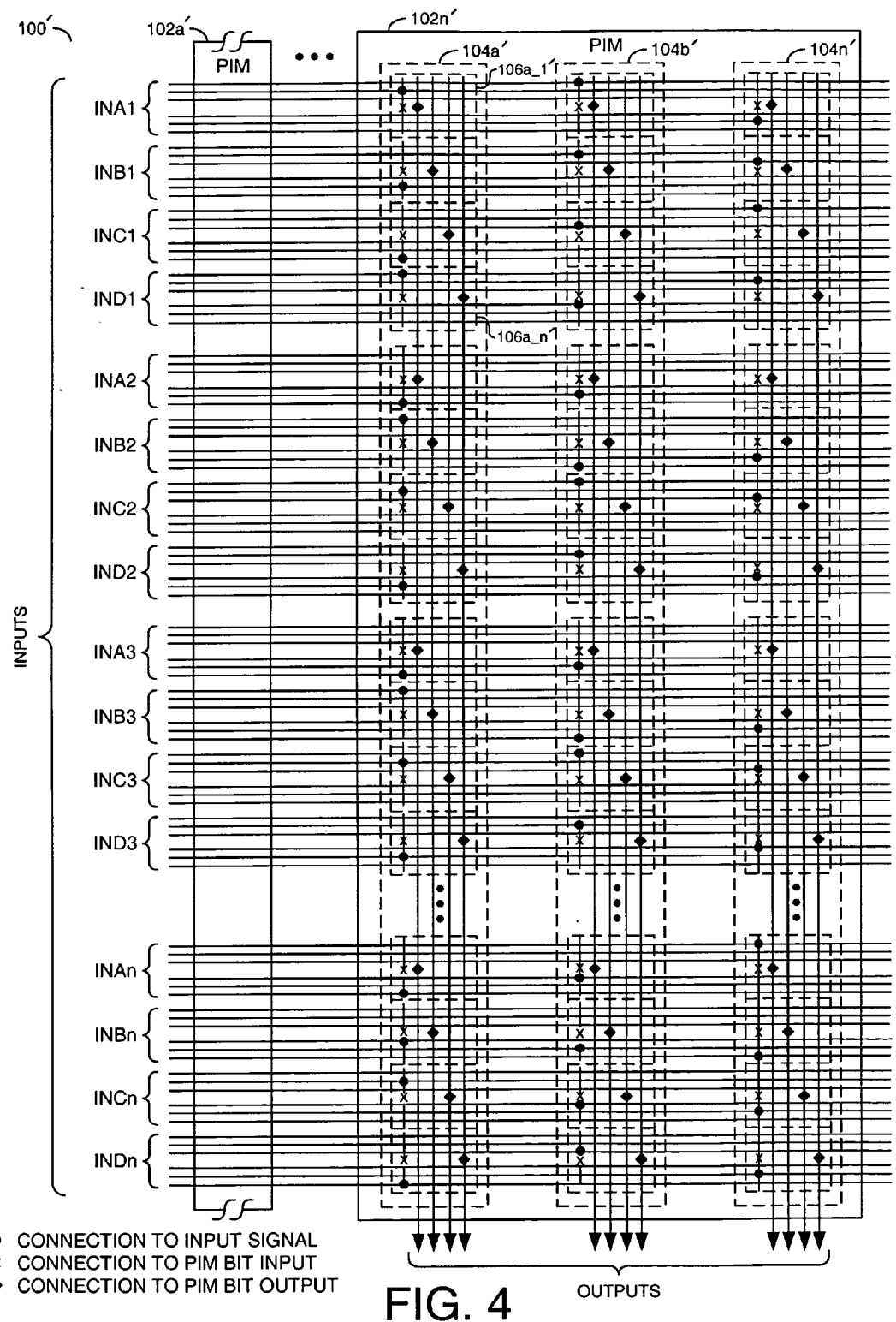
FIG. 4 is a detailed block diagram of the circuit of FIG. 3.

Referring to FIG. 4, a detailed diagram illustrating connections of the multiplexers 106a'–106n' is shown. The multiplexer bits 106a_1'–106n__n' may connect the input groups INA, INB, INC and IND and the outputs OUTPUTS. A configuration of the PIMS 102a'–102n' may be expanded or contracted to implement any appropriate number or size of multiplexers. Additionally, the size (e.g., bit width) of the input groups may be varied. The input signals INPUTS may connect to one or more of the PIMs 102a'–102n'. For example, the bit 106a_1' may receive one of the lines of the group INA1. A bit 107a_1' may receive one of the lines of the group INA1. The line received by the bit 106a_1' may be the same line or a different line than the line received by the bit 107a_1'. Furthermore, a bit 108a_1' may receive one of the lines of the group INA1. The line received by the bit 108a_1' may be the same line or a different line than the line received by the bit 106a_1' and/or the line received by the bit 107a_1'. Each of the multiplexers 106a'–106n' may have only one of the multiplexer bits programmed to allow the signals of the input groups INA, INB, INC, and IND of the signal INPUTS to pass through. The multiplexer output signals OUTPUTS may be connected to a next stage of the PIMs 102a'–102n', which may be another multiplexer stage, output drivers or other appropriate device.

Figure 5:
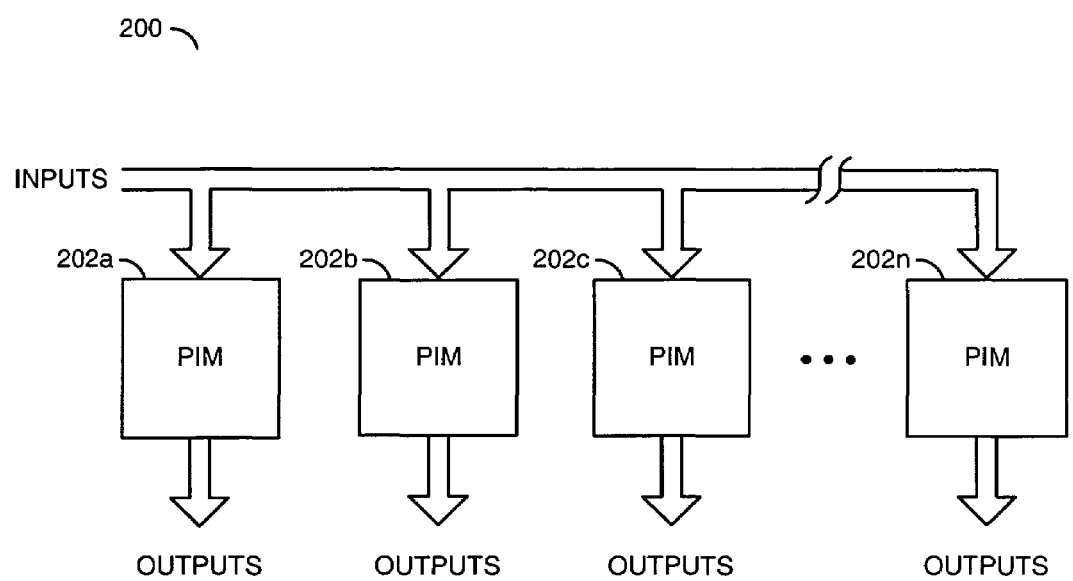
FIG. 5 is a block diagram of an implementation of the present invention.

Referring to FIG. 5, a circuit (or system) 200 is shown illustrating an implementation of the present invention. The circuit 200 generally comprises a number of PIMs 202a–202n. The PIMs 202a–202n may be similar to the circuits 102 and/or 102' of the present invention. The particular number of the PIMS 202a–202n may be varied in order to meet the design criteria of a particular application.

Each of the PIMs 202a–202n may receive an input (e.g. INPUTS). The signal INPUTS may comprise multi-bit and/or single-bit signals. In one example, the signal INPUTS may be implemented as a multi-bit input bus. In another example, the signal INPUTS may be implemented as one or more distributed input groups. Each of the PIMs 202a–202n may also be configured to generate an output signal (e.g. OUTPUTS). The signal OUTPUTS may comprise multi-bit and/or single-bit signals. The PIMs 202a–202n may each be implemented as a variable number of multiplexers. A width of the multiplexers may also be varied. For example, the PIM 202a may be implemented as a single multiplexer, two multiplexers, one hundred multiplexers, etc. of variable width. However, the particular number of multiplexers may be varied in order to meet the design criteria of a particular implementation.

The circuit 100 (or 100') may be designed using 0.18 μm process technology. However, the present invention may be applicable for other technologies and devices. The present invention may provide a flexible implementation of a programmable interconnect matrix comprising distributed multiplexers and distributed input groups across multiple PIMs. The present invention may, therefore, reduce or eliminate channel re-ordering, output routing and/or loading. The multiplexer bits may also be in an interleaved (or distributed) configuration. The input signal groupings and sizes of the PIMs 102a'–102n' may be determined across an entire family of devices. The layout area of the present invention may be determined by the size of the multiplexers implemented and not by the interconnect routing. Therefore, a size and/or configuration of the PIMs 102a'–102n' may be deterministic.

The present invention may minimize input parasitic loading by implementing a single short route across a PIM bit. The present invention may also provide similar output loading on all the multiplexers A, B, C and D. The layout area of the PIMs 102a'–102n' to be defined by multiplexer area and not the re-ordering interconnect. The present invention may provide for ease of reprogramming (e.g., contact programmable).

The present invention may allow expansion or contraction of the PIMs in either a horizontal or vertical direction to improve routability. The present invention may produce a deterministic layout area. The present invention may produce a deterministic best case and worst case path delay. The present invention may provide an input grouping configuration that may allow the inputs to be consistent across multiple PIMs resulting in deterministic delays.

The present invention may allow PIM structure definitions for an entire family of devices. The present invention may allow utilization of the same input groups for the PIMs 102a'–102n'. The present invention may provide a group and/or output routing method. The present invention may provide PIMs with deterministic delays. Such a configuration may allow for rerouting of signals through a PIM without changing the best case or worst case delays through the PIM.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
    a first programmable interconnect matrix having one or more first multiplexers configured to (i) receive a distributed input group of signals in a first order and (ii) present said distributed input group of signals in a second order; and a second programmable interconnect matrix having one or more second multiplexers configured to receive said distributed input group of signals from said first programmable interconnect matrix in said second order, wherein (i) said first order of said signals are different from said second order of said signals, (ii) said second order of said signals are disposed in an input-re-order channel and (iii) said apparatus is scalable.

2. The apparatus according to claim 1, wherein said distributed input group of signals are divided into a first group of input signals and a second group of input signals, wherein said first group of input signals is presented to one of said first multiplexers and said second group of input signals is presented to another of said first multiplexers.

3. The apparatus according to claim 2, wherein any one of said second multiplexers is configured to receive a mix of inputs from said first and second groups of input signals.

4. The apparatus according to claim 1, wherein said apparatus comprises a plurality of bits each configured to evenly load said input groups.

5. The apparatus according to claim 4, wherein said bits comprise programmable interconnect matrix (PIM) bits.

6. The apparatus according to claim 1, wherein said apparatus is configured to provide flexible reprogramming of said first programmable interconnect matrix and second programmable interconnect matrix.

7. The apparatus according to claim 1, wherein a configuration of said apparatus is expandable in a horizontal direction.

8. The apparatus according to claim 7, wherein said configuration of said apparatus is expandable in a vertical direction.

9. The apparatus according to claim 8, wherein said configuration reduces complexity of physical routes of said distributed input groups.

10. The apparatus according to claim 1, wherein a layout of said apparatus is deterministic.

11. The apparatus according to claim 1, wherein a delay of said apparatus is deterministic.

12. An apparatus comprising:

a first distributed multiplexer configured to generate a first output signal in response to (i) a first portion coupled to a first group of input signals and (ii) a second portion coupled to a second group of input signals; and a second distributed multiplexer configured to generate a second output signal in response to a (i) a first portion coupled to a third group of input signals and (ii) a second portion coupled to a fourth group of input signals, wherein (i) said first portion of said first distributed multiplexer is physically separated from said second portion of said first distributed multiplexer on a layout area, (ii) said first portion of said second distributed multiplexer is physically separated from said second portion of said second distributed multiplexer on said layout area, and (iii) said apparatus provides (a) a deterministic layout area and (b) an input grouping configuration which allows said first and second groups of input signals to remain consistent across any number of distributed multiplexers.

13. The apparatus according to claim 12, wherein (i) said first portion of said first distributed multiplexer comprises a programmable multiplexer bit coupled to any of said first group of input signals and (ii) said second portion of said first distributed multiplexer comprises a programmable multiplexer bit coupled to any of said second group of input signals to allow any of said first or second groups of input signals to pass through on said first output signal.

14. The apparatus according to claim 12, wherein (i) said first portion of said second distributed multiplexer and comprises a programmable multiplexer bit coupled to any of said third group of input signals and (ii) said second portion of said second distributed multiplexer comprises a programmable multiplexer bit coupled to any of said fourth group of input signals to allow any of said third or fourth groups of input signals to pass through on said second output signal.

15. The apparatus according to claim 12, wherein (i) said first portion of said first distributed multiplexer is separated from said second portion of said first distributed multiplexer on a die and (ii) said first portion of said second distributed multiplexer is separated from said second portion of second distributed multiplexer on a die.

16. The apparatus according to claim 12, further comprising a programmable interconnect matrix configured to be expanded or contracted to implement any number of distributed multiplexers.

17. The apparatus according to claim 12, wherein a plurality of said first distributed multiplexers and a plurality of said second distributed multiplexers are implemented as a programmable interconnect matrix.

18. An apparatus comprising:

a first programmable interconnect matrix having one or more first multiplexers configured to (i) receive a distributed input group of signals in a first order and (ii) present said distributed input group of signals in a second order; and a second programmable interconnect matrix having one or more second multiplexers configured to receive said distributed input group of signals from said first programmable interconnect matrix in said second order, wherein (i) said first order of said signals are different from said second order of said signals, (ii) said second order of said signals are disposed in an input-re-order channel and (iii) said apparatus is configured to provide flexible reprogramming of said first programmable interconnect matrix and second programmable interconnect matrix.

* * * * *